US009368370B2

(12) United States Patent
Belostotskiy et al.

(10) Patent No.: US 9,368,370 B2
(45) Date of Patent: Jun. 14, 2016

(54) TEMPERATURE RAMPING USING GAS DISTRIBUTION PLATE HEAT

(71) Applicant: Applied Materials, Inc., Santa Clara, CA (US)

(72) Inventors: Sergey G. Belostotskiy, Bellevue, WA (US); Chinh Dinh, San Jose, CA (US); Qingjun Zhou, San Jose, CA (US); Srinivas D. Nemani, Sunnyvale, CA (US); Andrew Nguyen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/642,340

(22) Filed: Mar. 9, 2015

(65) Prior Publication Data

US 2015/0262834 A1 Sep. 17, 2015

Related U.S. Application Data

(60) Provisional application No. 61/953,593, filed on Mar. 14, 2014.

(51) Int. Cl.
*H01L 21/302* (2006.01)
*H01L 21/311* (2006.01)
*H01L 21/263* (2006.01)
*H01J 37/32* (2006.01)

(52) U.S. Cl.
CPC ....... *H01L 21/31116* (2013.01); *H01J 37/3244* (2013.01); *H01J 37/32091* (2013.01); *H01J 37/32357* (2013.01); *H01J 37/32422* (2013.01); *H01L 21/263* (2013.01)

(58) Field of Classification Search
CPC ..................... H01L 21/3116; H01L 21/02126; H01L 21/02167; H01L 21/02203; H01L 21/263

USPC ......... 216/37, 67; 438/705, 715; 156/345.48, 156/345.28, 345.34, 345.24
See application file for complete search history.

(56) References Cited

U.S. PATENT DOCUMENTS

| 7,820,017 | B2 * | 10/2010 | Baubet | B32B 17/10174 204/192.16 |
|---|---|---|---|---|
| 8,475,674 | B2 * | 7/2013 | Thadani | H01L 21/31116 216/37 |
| 2005/0205110 | A1 * | 9/2005 | Kao | H01J 37/32082 134/1.1 |
| 2009/0283217 | A1 | 11/2009 | Lubomirsky et al. | |

(Continued)

OTHER PUBLICATIONS

PCT international search report and written opinion of PCT/US2015/019619 dated May 29, 2015.

*Primary Examiner* — Duy Deo
*Assistant Examiner* — Maki Angadi
(74) *Attorney, Agent, or Firm* — Patterson & Sheridan, LLP

(57) ABSTRACT

A method for etching a dielectric layer disposed on a substrate is provided. The method includes de-chucking the substrate from an electrostatic chuck in an etching processing chamber, and cyclically etching the dielectric layer while the substrate is de-chucked from the electrostatic chuck. The cyclical etching includes remotely generating a plasma in an etching gas mixture supplied into the etching processing chamber to etch the dielectric layer disposed on the substrate at a first temperature. Etching the dielectric layer generates etch byproducts. The cyclical etching also includes vertically moving the substrate towards a gas distribution plate in the etching processing chamber, and flowing a sublimation gas from the gas distribution plate towards the substrate to sublimate the etch byproducts. The sublimation is performed at a second temperature, wherein the second temperature is greater than the first temperature.

20 Claims, 2 Drawing Sheets

(56) References Cited

U.S. PATENT DOCUMENTS

2011/0056514 A1* 3/2011 Lee .................... H01J 37/321 134/1.1

2011/0151669 A1 6/2011 Lin et al.
2012/0052690 A1 3/2012 Belostotskiy et al.
2012/0160808 A1 6/2012 Kikuchi et al.

* cited by examiner

TEMPERATURE RAMPING USING GAS DISTRIBUTION PLATE HEAT

CROSS-REFERENCE TO RELATED APPLICATIONS

This application claims priority from U.S. Provisional Application Ser. No. 61/953,593 filed Mar. 14, 2014, which is hereby incorporated by reference in its entirety.

BACKGROUND

1. Field

Embodiments of the present invention generally relate to methods for temperature ramping in plasma processing. More particularly, embodiments of the present invention generally relate to methods for etching a dielectric material by using heat from a gas distribution plate for temperature ramping.

2. Description of the Related Art

Integrated circuits are made possible by processes which produce intricately patterned material layers on substrate surfaces. Producing patterned materials on a substrate requires controlled methods for removal of exposed material. Chemical etching is used for a variety of purposes including transferring a pattern in a photoresist into underlying layers, thinning layers or thinning lateral dimensions of features already present on the surface. Often the chemical etching results in unwanted by-products or residues, which are then sublimated and removed from the substrate surface. Although sublimation temperatures vary depending on the by-product being removed, some sublimation temperatures are greater than the temperatures required for the chemical etching itself. As such, the substrate temperature must be increased after the chemical etching is complete in order to sublime the by-products from the substrate.

Conventional techniques heat the substrate by increasing the temperature of the electrostatic chuck having the substrate clamped thereon. However, most of the bonding materials used in electrostatic chucks preclude the substrate temperature from being increased (e.g., ramped upward) at a rate greater than about 1.5 degrees Celsius/second. Additionally, current electrostatic chuck technology precludes safe and reliable operation at temperatures greater than about 110 degrees Celsius, which makes sublimation at temperatures greater than 110 degrees Celsius unwise as the sublimation process would require the electrostatic chuck to be operated beyond its design limits.

Thus, there is a need for an improved method for temperature ramping, and more specifically, an improved method for temperature ramping that does not solely rely on increasing the electrostatic chuck temperature.

SUMMARY

Methods for etching a dielectric layer followed by a sublimation process are disclosed herein which enable the use of high temperatures, thereby increasing substrate throughput.

In one embodiment, a method for etching a dielectric layer disposed on a substrate includes de-chucking the substrate from an electrostatic chuck in an etching processing chamber, and cyclically etching the dielectric layer while the substrate is de-chucked from the electrostatic chuck. The cyclical etching includes remotely generating a plasma from an etching gas mixture supplied into the etch processing chamber to etch the dielectric layer disposed on the substrate at a first temperature. Etching the dielectric layer may generate etch byproducts. The cyclical etching also includes vertically moving the substrate from an etching position towards a gas distribution plate to a sublimation position in the etching processing chamber, and flowing a sublimation gas from the gas distribution plate towards the substrate to sublimate the etch byproducts. The sublimation is performed at a second temperature, wherein the second temperature is greater than the first temperature.

In another embodiment, a method for etching a dielectric layer disposed on a substrate includes performing a treatment process on the substrate in an etching processing chamber, wherein the substrate is chucked on an electrostatic chuck. The method for etching further includes de-chucking the substrate from the electrostatic chuck, and etching the treated dielectric layer on the de-chucked substrate. Etching the treated dielectric layer on the de-chucked substrate includes (a) remotely generating a plasma from an etching gas mixture supplied into the etch processing chamber to etch the dielectric layer disposed on the substrate at a first temperature and a first pressure level. Etching the treated dielectric layer generates etch byproducts. Etching the treated dielectric layer on the de-chucked substrate also includes (b) vertically moving the substrate towards a gas distribution plate in the etching processing chamber, and (c) flowing a sublimation gas from the gas distribution plate towards the substrate to sublimate the etch byproducts at a second temperature and a second pressure level. The second temperature is greater than the first temperature and the second pressure level is less than the first pressure level, and (a)-(c) are performed cyclically.

In another embodiment, a method for etching a dielectric layer disposed on a substrate includes performing a treatment process on the substrate in an etching processing chamber, wherein the substrate is chucked on an electrostatic chuck. The treatment process includes bombarding the dielectric layer with an ion flux to alter surface properties of the dielectric layer. The method for etching further includes de-chucking the substrate from the electrostatic chuck, and etching the treated dielectric layer on the de-chucked substrate. Etching the treated dielectric layer on the de-chucked substrate includes (a) remotely generating a plasma from an etching gas mixture supplied into the etch processing chamber to etch the dielectric layer disposed on the substrate at a first temperature and a first pressure level. Etching the treated dielectric layer generates etch byproducts. Etching the treated dielectric layer on the de-chucked substrate also includes (b) vertically moving the substrate towards a gas distribution plate in the etching processing chamber, and (c) flowing a sublimation gas from the gas distribution plate towards the substrate to sublimate the etch byproducts at a second temperature and a second pressure level. The second temperature is greater than the first temperature and the second pressure level is less than the first pressure level, and (a)-(c) are performed cyclically.

BRIEF DESCRIPTION OF THE DRAWINGS

So that the manner in which the above recited features of the present invention can be understood in detail, a more particular description of the invention, briefly summarized above, can be had by reference to embodiments, some of which are illustrated in the appended drawings. It is to be noted, however, that the appended drawings illustrate only typical embodiments of this invention and are therefore not to be considered limiting of its scope, for the invention can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Methods for etching a dielectric layer followed by a sublimation process are disclosed herein. The methods enable the use of high etching temperatures, thereby increasing substrate throughput.

Figure 1:
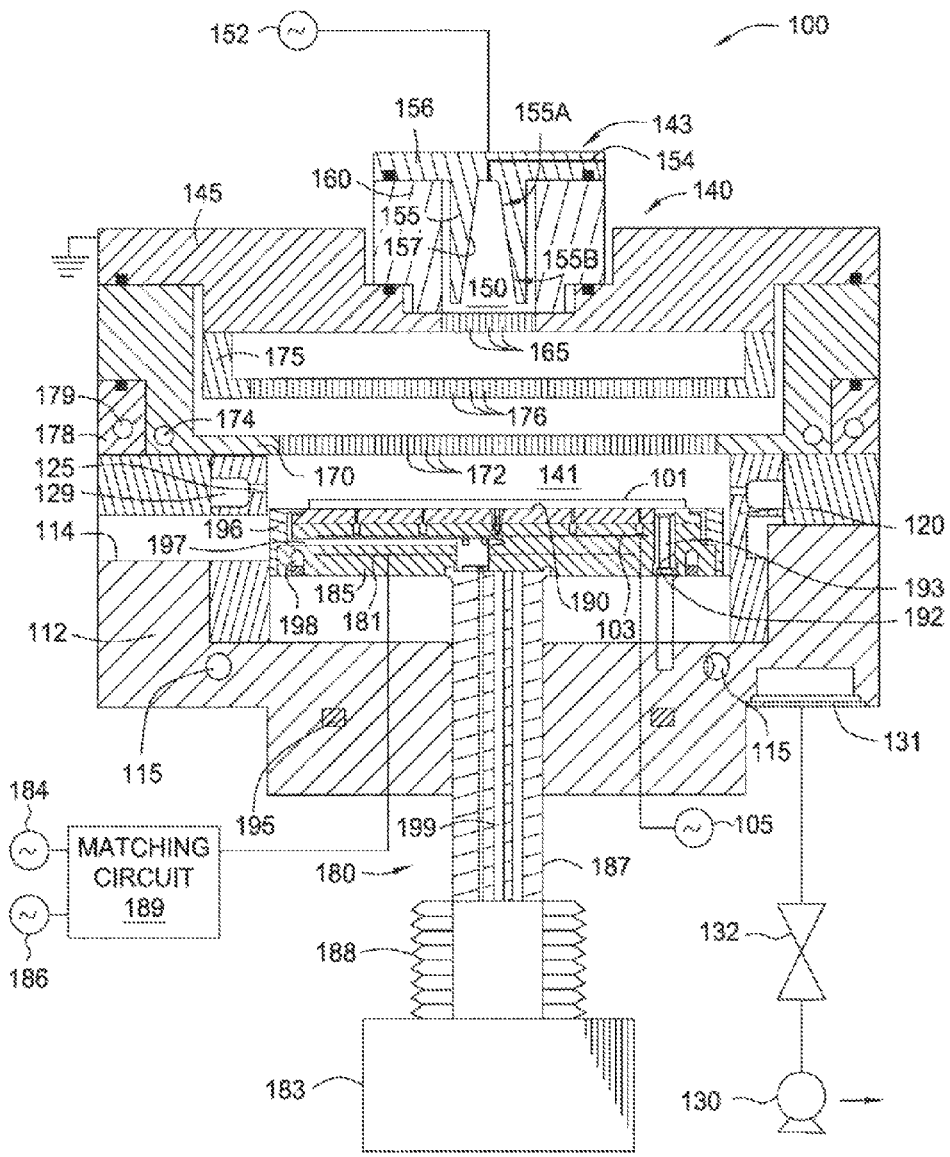
FIG. 1 is a cross section view of an illustrative processing chamber in which embodiments of the invention may be practiced.

FIG. 1 is a cross sectional view of an illustrative processing chamber 100 suitable for conducting an etching process as further described below. The chamber 100 is configured to remove materials from a material layer disposed on a substrate 101 surface. The chamber 100 is particularly useful for performing a plasma assisted selective dry etch process. One processing chamber 100 suitable for practicing the invention is the SICONI™ processing chamber, which is available from Applied Materials, Inc., located in Santa Clara, Calif. It is noted that other vacuum processing chambers available from other manufactures may also be adapted to practice the present invention.

The chamber 100 provides both heating and cooling of the substrate 101 surface without breaking vacuum. In one embodiment, the processing chamber 100 includes a chamber body 112, a lid assembly 140, and a support assembly 180. The lid assembly 140 is disposed at an upper end of the chamber body 112. The support assembly 180 is at least partially disposed within the chamber body 112.

The chamber body 112 includes a slit valve opening 114 formed in a sidewall thereof. The slit valve opening 114 is selectively opened and closed to allow access to the interior of the chamber body 112 by a substrate handling robot (not shown).

In one or more embodiments, the chamber body 112 includes a channel 115 formed therein for flowing a heat transfer fluid therethrough. The heat transfer fluid may be a heating fluid or a coolant and is used to control the temperature of the chamber body 112 during processing. Control of the temperature of the chamber body 112 helps prevent unwanted condensation of the gas or byproducts on the interior of the chamber body 112. In one embodiment, heat transfer fluids include water, ethylene glycol, or a mixture thereof. In another embodiment, a heat transfer fluid may also include nitrogen gas.

The chamber body 112 may further include a liner 120 that surrounds the support assembly 180. The liner 120 is removable for servicing and cleaning. The liner 120 may be made of a metal such as aluminum, a ceramic material, or any other process compatible material. The liner 120 may be bead blasted to increase surface roughness and/or surface area which increases the adhesion of any material deposited thereon, thereby preventing flaking of material which results in contamination of the chamber 100. In one or more embodiments, the liner 120 includes one or more apertures 125 and a pumping channel 129 formed therein that is in fluid communication with a vacuum port 131. The apertures 125 provide a flow path for gases into the pumping channel 129. The pumping channel 129 provides an egress for the gases within the chamber 100 to the vacuum port 131.

A vacuum system is coupled to the vacuum port 131. The vacuum system may include a vacuum pump 130 and a throttle valve 132. The throttle valve 132 regulates the flow of gases through the chamber 100. The vacuum pump 130 is coupled to the vacuum port 131 disposed in the chamber body 112. The vacuum pump 130 is in fluid communication with the pumping channel 129 formed within the liner 120. The terms "gas" and "gases" are used interchangeably, unless otherwise noted, and refer to one or more precursors, reactants, catalysts, carrier, purge, cleaning, combinations thereof, as well as any other fluid introduced into the chamber body 112.

The lid assembly 140 includes at least two stacked components configured to form a plasma volume or cavity therebetween. In one or more embodiments, the lid assembly 140 includes a first electrode 143 ("upper electrode") disposed vertically above a second electrode 145 ("lower electrode"). The upper electrode 143 and the lower electrode 145 confine a plasma volume or cavity 150 therebetween. The first electrode 143 is connected to a power source 152, such as an RF power supply. The second electrode 145 is connected to ground, forming a capacitance between the two electrodes 143,145.

In one or more embodiments, the lid assembly 140 includes one or more gas inlets 154 (only one is shown). The one or more gas inlets 134 are at least partially formed within an upper section 156 of the first electrode 143. The one or more process gases enter the lid assembly 140 via the one or more gas inlets 154. The one or more gas inlets 154 are in fluid communication with the plasma cavity 150 at a first end thereof. The one or more gas inlets 154 are coupled to one or more upstream gas sources and/or other gas delivery components, such as gas mixers, at a second end thereof.

In one or more embodiments, the first electrode 143 has an expanding section 155 that bounds the plasma cavity 150. In one or more embodiments, the expanding section 155 is an annular member that has an inner surface or diameter 157 that gradually increases from an upper portion 155A thereof to a lower portion 155B thereof. As such, the distance between the first electrode 143 and the second electrode 145 is variable across the expanding section 155. The varying distance helps control the formation and stability of the plasma generated within the plasma cavity 150.

In one or more embodiments, the expanding section 155 resembles an inverted truncated cone or "funnel." In one or more embodiments, the diameter 157 of the expanding section 155 gradually slopes from the upper portion 155A to the lower portion 155B of the expanding section 155. The slope or angle of the diameter 157 may vary depending on process requirements and/or process limitations. The length or height of the expanding section 155 may also vary depending on specific process requirements and/or limitations.

As mentioned above, the expanding section 155 of the first electrode 143 varies the vertical distance between the first electrode 143 and the second electrode 145 because of the gradually increasing diameter 157 of the first electrode 143. The variable distance directly influences the power level within the plasma cavity 150. Not wishing to be bound by theory, the variation in distance between the two electrodes 143, 145 allows the plasma to find the necessary power level to sustain itself within some portion of the plasma cavity 150 if not throughout the entire plasma cavity 150. The plasma within the plasma cavity 150 is therefore less dependent on pressure, allowing the plasma to be generated and sustained within a wider operating window. As such, a more repeatable and reliable plasma may be formed within the lid assembly 140. As the plasma generated in the plasma cavity 150 is defined in the lid assembly 140 prior to entering into a processing region 141 above the support assembly 180 wherein the substrate 101 is proceed, the lid assembly 140 is considered as a remote plasma source because the plasma generated remotely from the processing region 141.

The expanding section 155 is in fluid communication with the gas inlet 154 as described above. The first end of the one or more gas inlets 154 can open into the plasma cavity 150 at the upper most point of the inner diameter 157 of the expanding section 155. Similarly, the first end of the one or more gas inlets 154 can open into the plasma cavity 150 at any height interval along the diameter 157 of the expanding section 155. Although not shown, two gas inlets 154 may be disposed at opposite sides of the expanding section 155 to create a swirling flow pattern or "vortex" flow into the expanding section 155 which helps mix the gases within the plasma cavity 150.

The lid assembly 140 may also include an isolator ring 160 that electrically isolates the first electrode 143 from the second electrode 145. The isolator ring 160 may be made from aluminum oxide or any other insulative, process compatible material. The isolator ring 160 surrounds or substantially surrounds at least the expanding section 155.

The lid assembly 140 may also include a gas distribution plate 170 and blocker plate 175 adjacent the second electrode 145. The second electrode 145, gas distribution plate 170 and blocker plate 175 may be stacked and disposed on a lid rim 178 which is connected to the chamber body 112. A hinge assembly (not shown) may be used to couple the lid rim 178 to the chamber body 112. The lid rim 178 may include an embedded channel or passage 179 for circulating a heat transfer medium. The heat transfer medium may be used for heating, cooling, or both, depending on the process requirements.

In one or more embodiments, the second electrode or top plate 145 may include a plurality of gas passages or apertures 165 formed beneath the plasma cavity 150 to allow gas from the plasma cavity 150 to flow therethrough. The gas distribution plate 170 is substantially disc-shaped and also includes a plurality of apertures 172 or passageways to distribute the flow of gases therethrough. The gas distribution plate 170 may be heated to a temperature between about 170 degrees Celsius and about 190 degrees Celsius, e.g., about 180 degrees Celsius. The apertures 172 may be sized and positioned about the gas distribution plate 170 to provide a controlled and even flow distribution to the processing region 141 of the chamber body 112 where the substrate 101 to be processed is located. Furthermore, the apertures 172 prevent the gas(es) from impinging directly on the substrate 101 surface by slowing and re-directing the velocity profile of the flowing gases, as well as evenly distributing the flow of gas to provide an even distribution of gas across the surface of the substrate 101.

In one or more embodiments, the gas distribution plate 170 includes one or more embedded channels or passages 174 for housing a heater or heating fluid to provide temperature control of the lid assembly 140. A resistive heating element (not shown) may be inserted within the passage 174 to heat the gas distribution plate 170. A thermocouple (not shown) may be connected to the gas distribution plate 170 to regulate the temperature thereof. The thermocouple may be used in a feedback loop to control electric current applied to the heating element, as described above.

Alternatively, a heat transfer medium may be passed through the passage 174. The one or more passages 174 can contain a cooling medium, if needed, to better control temperature of the gas distribution plate 170 depending on the process requirements within the chamber body 112. Any heat suitable transfer medium may be used, such as nitrogen, water, ethylene glycol, or mixtures thereof, for example.

In one or more embodiments, the lid assembly 140 may be heated using one or more heat lamps (not shown). Typically, the heat lamps are arranged about an upper surface of the gas distribution plate 170 to heat the components of the lid assembly 140 including the gas distribution plate 170 by radiation.

The blocker plate 175 may optionally be disposed between the second electrode 145 and the gas distribution plate 170. The blocker plate 175 is removably mounted to a lower surface of the second electrode 145. The blocker plate 175 may be in good thermal and electrical contact with the second electrode 145. In one or more embodiments, the blocker plate 175 may be coupled to the second electrode 145 using a bolt or similar fastener. The blocker plate 175 may also be threaded or screwed onto an outer diameter of the second electrode 145.

The blocker plate 175 includes a plurality of apertures 176 to provide a plurality of gas passages from the second electrode 145 to the gas distribution plate 170. The apertures 176 may be sized and positioned about the blocker plate 175 to provide a controlled and even flow distribution of gases to the gas distribution plate 170.

The support assembly 180 may include a support member 185 to support the substrate 101 for processing within the chamber body 112. The support member 185 may be coupled to a lift mechanism 183 through a shaft 187 which extends through a slit valve opening 114 formed in a bottom surface of the chamber body 112. The lift mechanism 183 may be flexibly sealed to the chamber body 112 by a bellows 188 that prevents vacuum leakage from around the shaft 187. The lift mechanism 183 allows the support member 185 to be moved vertically within the chamber body 112 between a lower transfer position and a number of raised process positions. In one embodiment, the transfer position is slightly below the slit valve opening 114 formed in a sidewall of the chamber body 112, so that the substrate 101 may be robotically removed from the substrate support member 185.

The support member 185 may be moved vertically within the chamber body 112 so that a distance between support member 185 and the lid assembly 140 may be controlled during processing. A sensor (not shown) may provide information concerning the position of support member 185 within chamber 100.

In operation, the support member 185 may be elevated to a close proximity of the lid assembly 140 to control the temperature of the substrate 101 being processed. As such, the substrate 101 may be heated via radiation emitted from the gas distribution plate 170. Alternatively, the substrate 101 may be lifted off the support member 185 to close proximity of the heated lid assembly 140 using the lift pins 193 activated by the lift ring 195.

In one or more embodiments, the support member 185 has a flat, circular surface or a substantially flat, circular surface for supporting the substrate 101 to be processed thereon. The support member 185 may be constructed of aluminum. The support member 185 may include a removable top plate 190 made of some other material, such as silicon or ceramic material, for example, to reduce backside contamination of the substrate 101.

In one or more embodiments, the substrate 101 may be secured to the support member 185 using a vacuum chuck. In one or more embodiments, the substrate 101 may be secured to the support member 185 using an electrostatic chuck. An electrostatic chuck typically includes at least a dielectric material that surrounds a plasma power electrode 181 and a chucking electrode 103, which may both be located on the support member 185 or formed as an integral part of the support member 185. The dielectric portion of the electrostatic chuck electrically insulates the plasma power electrode 181 and the chucking electrode 103 from the substrate 101 and from the remainder of the support assembly 180.

In one embodiment, the plasma power electrode 181 is coupled to a plurality of RF power bias sources 184, 186. The RF bias power sources 184, 186 provide RF power to the plasma power electrode 181. The plasma power electrode 181 excites and sustains a plasma discharge formed from the gases disposed in the processing region 141 of the chamber body 112.

In the embodiment depicted in FIG. 1, the dual RF bias power sources 184, 186 are coupled to the plasma power electrode 181 disposed in the support member 185 through a matching circuit 189. The signal generated by the RF bias power sources 184, 186 is delivered through matching circuit 189 to the support member 185 through a single feed to ionize the gas mixture provided in the chamber 100. Ionizing the gas mixture provides ion energy necessary for performing a deposition, etch, or other plasma enhanced process. The RF bias power sources 184, 186 are generally capable of producing an RF signal having a frequency of from about 50 kHz to about 200 MHz and a power between about 0 Watts and about 5000 Watts. Additional bias power sources may be coupled to the plasma power electrode 181 to control the characteristics of the plasma as needed.

In one embodiment, the chucking electrode 103 is coupled to an RF power source 105. The RF power source 105 provides RF power to the chucking electrode 103. The chucking electrode 103 generates an electrostatic holding force between the electrostatic chuck and the substrate 101. The RF power source 105 is generally capable of producing an RF signal having a frequency of from about 50 kHz to about 200 MHz, e.g., about 2 MHz or about 60 MHz, and a power between about 0 Watts and about 5000 Watts.

The support member 185 may include bores 192 formed therethrough to accommodate lift pins 193, one of which is shown in FIG. 1. Each lift pin 193 is constructed of ceramic or ceramic-containing materials, and is used for substrate-handling and transport. The lift pin 193 is moveable within its respective bore 192 when engaging an annular lift ring 195 disposed within the chamber body 112. The lift ring 195 is movable such that the upper surface of the lift pin 193 may be extended above the substrate support surface of the support member 185 when the lift ring 195 is in an upper position. Conversely, the upper surface of the lift pins 193 is located below the substrate support surface of the support member 185 when the lift ring 195 is in a lower position. Thus, each lift pin 193 is moved in its respective bore 192 in the support member 185 when the lift ring 195 moves between the lower position and the upper position.

The support assembly 180 may further include an edge ring 196 disposed around the support member 185. In one or more embodiments, the edge ring 196 is an annular member that is adapted to cover an outer perimeter of the support member 185 and protect the support member 185 from deposition. The edge ring 196 may be positioned on or adjacent the support member 185 to form an annular purge gas channel between the outer diameter of support member 185 and the inner diameter of the edge ring 196. The annular purge gas channel may be in fluid communication with a purge gas conduit 197 formed through the support member 185 and the shaft 187. The purge gas conduit 197 is in fluid communication with a purge gas supply (not shown) to provide a purge gas to the purge gas channel. Any suitable purge gas such as nitrogen, argon, or helium, may be used alone or in combination. In operation, the purge gas flows through the purge gas conduit 197, into the purge gas channel, and about an edge of the substrate 101 disposed on the support member 185. Accordingly, the purge gas working in cooperation with the edge ring 196 prevents deposition at the edge and/or backside of the substrate 101.

The temperature of the support assembly 180 may be controlled by a fluid circulated through a fluid channel 198 embedded in the body of the support member 185. In one or more embodiments, the fluid channel 198 is in fluid communication with a heat transfer conduit 199 disposed through the shaft 187 of the support assembly 180. The fluid channel 198 is positioned about the support member 185 to provide a uniform heat transfer to the substrate receiving surface of the support member 185. The fluid channel 198 and heat transfer conduit 199 may flow heat transfer fluids to either heat or cool the support member 185 and substrate 101 disposed thereon. Any suitable heat transfer fluid may be used, such as water, nitrogen, ethylene glycol, or mixtures thereof. The support member 185 can further include an embedded thermocouple (not shown) for monitoring the temperature of the support surface of the support member 185, which is indicative of the temperature of the substrate 101 disposed thereon. For example, a signal from the thermocouple may be used in a feedback loop to control the temperature or flow rate of the fluid circulated through the fluid channel 198.

A system controller (not shown) may be used to regulate the operations of the processing chamber 100. The system controller can operate under the control of a computer program stored on a memory of a computer. The computer program may include instructions that enable the process described below to be performed in the processing chamber 100. For example, the computer program can dictate the process sequencing and timing, mixture of gases, chamber pressures, RF power levels, susceptor positioning, slit valve opening and closing, substrate cooling and other parameters of a particular process.

Figure 2:
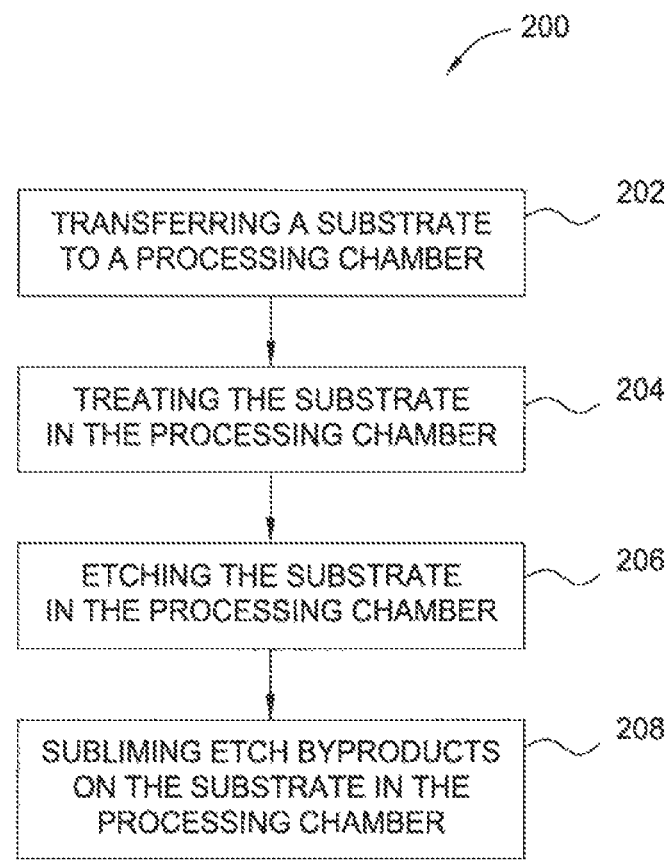
FIG. 2 is a flow diagram for a process sequence in accordance with one embodiment of the present invention.

FIG. 2 illustrates a process sequence 200 used to perform an etching process. In one embodiment, the process sequence 200 is used to etch a dielectric material, e.g., a low-k material, disposed on the substrate 101 with high etching selectivity. A low-k material, as used herein, refers to any material that has a dielectric constant less than 3.9, i.e., less than that of silicon dioxide. The process sequence 200 corresponds to the chamber 100 depicted in FIG. 1, however, it is contemplated that the process sequence 200 may correspond to any vacuum processing chamber.

The process sequence 200 begins at block 202 by transferring the substrate 101 into the chamber 100. In one embodiment the substrate 101 may be a material such as crystalline silicon (e.g., Si<100> or Si<111>), monocrystalline silicon, silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire or sapphire.

The dielectric material disposed on the substrate 101 is masked for a via or trench etch and has an exposed and non-exposed surface. In one embodiment, the dielectric material is a carbon containing silicon layer (SiC), a nitrogen doped carbon containing silicon layer (SiCN), or the like. In another embodiment, the dielectric material is a low-k material such as, but not limited to, a fluorine-doped silicon dioxide, a carbon-doped dioxide, a porous silicon dioxide, a porous carbon-doped silicon dioxide, a spin-on silicone based polymeric dielectric or a spin-on organic polymeric dielectric. In one embodiment, the dielectric material is a low-k material that is a porous SiCOH having a bulk dielectric constant of less than about 2.7.

At block 204, a treatment process is performed to alter surface properties of the dielectric material and facilitate removal of the dielectric material in a subsequent chemical etching process. In one embodiment, the treatment process includes bombarding the dielectric material with an ion flux to alter the surface properties of the dielectric material. The treatment process is an anisotropic ion-induced treatment so that regions underlying the exposed dielectric material are not exposed to the ion flux. The ion flux may be of one or more types of atomic or molecular species. The treated dielectric material may then easily react with chemical etching gases subsequently supplied into the processing chamber 100 at block 206, forming etching byproducts which will later be sublimated and pumped out of the processing chamber 100.

The treatment process performed at block 204 includes supplying a treatment gas mixture into the chamber 100. In one embodiment, the treatment gas mixture may include helium, neon, xenon, nitrogen, argon or combinations thereof. A plasma is then formed from the treatment gas mixture to plasma treat the exposed surfaces of the dielectric material. The treatment process activates ion species in the plasma to form helium ions, neon ions, xenon ions, nitrogen ions, or argon ions, e.g., Ar+. In one embodiment, the ion species have a low ionization potential, e.g., about $2^{-4}$ eV, to reduce energy levels of the ion flux. For example, in one embodiment neon and helium may be added to argon ions with Ar+ to further tune the ion flux energy. In embodiments where the dielectric material is low-k material that is a porous SiCOH, the ion species knock off the carbon species from the silicon-oxide matrix.

During the ion-induced treatment process, several process parameters may be regulated to control the treatment process. In one embodiment, the substrate 101 is chucked to support member 185. The process pressure in the processing chamber 100 is regulated under about 10 mTorr, e.g., under about 5 mTorr, for example about 1.5 mTorr, for controlling the directionality of the ion species. A RF power of about 50 Watts to about 100 Watts may be applied to the lid assembly 140 to maintain a plasma inside the processing chamber 100. The substrate 101 temperature is between about 65 degrees Celsius to about 95 degrees Celsius, e.g., between about 70 degrees Celsius and about 90 degrees Celsius. While a temperature range is described, it is noted that the ion-induced treatment process is not a temperature-sensitive process.

At the end of the ion-induced treatment process at block 204, and prior to the subsequent chemical etching process at block 206, the substrate 101 is de-chucked from the electrostatic chuck of the substrate support member 185. De-chucked, as used herein, refers to reducing or turning off the electrostatic force applied to the substrate 101 without lifting the substrate 101 from the support member 185. For example, power supplied to the chucking electrode 103 may be reduced or turned off, to reduce or prevent an electrostatic force between the substrate 101 and the electrostatic chuck. Additionally, the backside gas, such as helium (He), is turned off. De-chucking the substrate 101 advantageously increases the heat transfer between the lid assembly 140 and the substrate 101, because the heat transfer between the substrate 101 and the electrostatic chuck decreases when the substrate 101 is de-chucked. De-chucking beneficially inhibits the ability of the electrostatic chuck to sink heat from the substrate 101. Sinking heat from the substrate 101 thereby causes the substrate 101 temperature to rise faster than cooling the electrostatic chuck, e.g., by increasing the cooling fluid supplied to the fluid channel 198. It is noted, however, that when the substrate 101 is de-chucked, power to a heating element from the electrostatic chuck may still be supplying heat to the substrate 101.

At block 206, a remote plasma etching process is performed on the substrate 101, having reached a desired temperature, to selectively etch the ion-treated dielectric material disposed on the substrate 101. The remote plasma etching process is a chemical process performed to remove the treated dielectric material on the substrate 101. The remote plasma chemical etching process is performed by supplying an etching gas mixture into the plasma cavity 150 into the processing chamber 100 to form a remote plasma in the plasma cavity 150 from the processing gas mixture prior to flow the processing gas for etching the modified dielectric material.

In one embodiment, the etching gas mixture used to remove the treated dielectric material is a mixture of ammonia ($NH_3$) and nitrogen trifluoride ($NF_3$) gases. The amount of each gas introduced into the processing chamber may be varied and adjusted to accommodate, for example, the thickness of the treated dielectric material to be removed, the geometry of the substrate 101 being processed, the volume capacity of the plasma cavity, the volume capacity of the chamber body, as well as the capabilities of the vacuum system coupled to the chamber body.

As the plasma is generated remotely in the plasma cavity 150, the etchants dissociated from the etching gas mixture from the remote source plasma is relatively mild and gentle, so as to gradually chemically react the treated dielectric material until an underlying material is exposed. In one embodiment, ammonia ($NH_3$) gas and the nitrogen trifluoride ($NF_3$) gas are dissociated in the remote plasma cavity 150, forming ammonium fluoride ($NH_4F$) and/or ammonium fluoride with HF($NH_4F.HF$). The etchants of ammonium fluoride ($NH_4F$) and ammonium fluoride with HF($NH_4F.HF$) may react with the dielectric material and forming ($NH_4)_2SiF_6$, a solid state byproduct, when the etchants of ammonium fluoride and ammonium fluoride with HF are introduced into the processing region 141 of the processing chamber 100, reaching upon the substrate 101 surface. The byproduct will be later removed from the substrate 101 surface by using a high temperature sublimation process, which will be discussed in further detail at block 208.

In one or more embodiments, the gases added to provide the etching gas mixture having at least a 1:1 molar ratio of ammonia ($NH_3$) to nitrogen trifluoride ($NF_3$). In one or more embodiments, the molar ratio of the etching gas mixture is at least about 3:1 (ammonia to nitrogen trifluoride). The gases are introduced in the chamber 100 at a molar ratio of from about 5:1 (ammonia to nitrogen trifluoride) to about 30:1. In yet another embodiment, the molar ratio of the etching gas mixture is from about 5:1 (ammonia to nitrogen trifluoride) to about 10:1. The molar ratio of the etching gas mixture can also fall between about 10:1 (ammonia to nitrogen trifluoride) and about 20:1.

In one embodiment, other types of gas, such as inert gas or carrier gas, may also be supplied in the etching gas mixture to assist carrying the etching gas mixture into the processing region 141 of the vacuum processing chamber 100. Suitable examples of the inert gas or carrier gas include at least one of Ar, He, $N_2$, $O_2$, $N_2O$, $NO_2$, NO, and the like. In one embodiment, the inert or carrier gas that may be supplied into the vacuum processing chamber 100 is Ar or He at a volumetric flow rate between about 200 sccm and about 1500 sccm.

A substrate 101 temperature may be maintained between about 65 degrees Celsius to about 95 degrees Celsius, e.g., between about 70 degrees Celsius and about 90 degrees Celsius while supplying the etching gas mixture to perform the remote plasma source etching process. It is believed that maintaining the substrate 101 temperature at the above ranges may assist increasing the etching rate of the etching process. It is believed that overly high temperatures will restrain chemical reactions between ammonia ($NH_3$) and nitrogen trifluoride ($NF_3$) to form the desired etchants, ammonium fluoride ($NH_4F$) and/or ammonium fluoride with HF($NH_4F \cdot HF$), for etching. Therefore, controlling the substrate 101 temperature at a range between about 65 degrees Celsius to about 95 degrees Celsius, e.g., between about 70 degrees Celsius and about 90 degrees Celsius, may desirably enhance the etching rate during the etching process, thereby increasing the overall etching process throughput.

After the etching gas mixture is supplied into the processing chamber and exposed to the substrate 101, the treated dielectric material may be then etched, forming a solid etching byproduct, such as ammonium fluorosilicate $(NH_4)_2SiF_6$, on the substrate 101 surface. The etching byproduct will be removed from the substrate 101 by a sublimation process, which will be further discussed below at block 208. The etching process may be continuously performed until the treated dielectric material disposed on the substrate 101 has been reacted and converted to the etching byproduct.

During the etching process, several process parameters may be regulated to control the etching process. In one embodiment, the chamber pressure may be increased from the previous pressure levels at the ion-induced treatment process at block 202 to above about 1 Torr, for example, greater than about 1.5 Torr. At high pressures, e.g., greater than about 1.5 Torr, the heat transfer from the gas distribution plate 170 of the lid assembly 140 to the substrate 101 increases. Therefore, even though the substrate 101 is de-chucked, i.e., electrostatic force is not applied and backside gas is not flowing and during the etching process, the high chamber pressure allows for strong thermocoupling between the substrate 101 and the electrostatic chuck of the support member 185 in order to maintain the substrate 101 at a desired temperature.

A RF source power at a frequency of about 80 KHz may be applied to maintain a plasma in the chemical etching gas mixture. For example, a RF source power of about between 20 Watts to about 70 Watts may be applied to the etching gas mixture. The RF source power as referred herein may be the RF power supplied from the power source 152 to the electrodes 143, 145. In one embodiment, the RF source power may have a frequency of about 80 KHz. The etching gas mixture may be flowed into the chamber at a rate between about 400 sccm to about 2000 sccm. In one embodiment, the etching process may be performed for between about 60 seconds and about 2000 seconds. It is noted, however, that the above recited process parameters may vary depending on the size of the processing chamber 100. In one embodiment, prior to the etching process, the gas distribution plate 170 has been pre-heated to a temperature greater than about 170 degrees Celsius, e.g., greater than about 180 degrees Celsius.

At block 208, after the etching process is completed and the treated dielectric material has substantially reacted and converted to the etching byproduct, a sublimation process is performed to remove the etching byproduct. Prior to performing the sublimation, the support member 185 is vertically moved upwards towards the gas distribution plate 170. As discussed above, in one embodiment, prior to the etching process, the gas distribution plate 170 has been pre-heated to a temperature greater than about 170 degrees Celsius, e.g., greater than about 180 degrees Celsius. Therefore, during the etching process, the gas distribution plate 170 is already heated at the desired temperature. In one embodiment, the substrate 101 is between about 0.1 inches to about 0.5 inches away, e.g., about 0.25 inches to about 0.3 inches, from the heated gas distribution plate 170. Advantageously, the close proximity of the gas distribution plate 170 to the substrate 101, as compared to during the treatment or etch processes, allows for faster heat transfer to the substrate 101.

In one embodiment, the sublimation pressure level is between about 100 mTorr to about 900 mTorr, for example about 200 mTorr, about 500 mTorr, or about 800 mTorr. The details of the sublimation pressure levels will be discussed further below. In another embodiment, the pressure in the processing chamber 100 is reduced from the remote plasma etching pressure level to a sublimation pressure level between about 100 mTorr to about 900 mTorr, for example about 200 mTorr, about 500 mTorr, or about 800 mTorr.

The sublimation process sublimates the etching byproduct into a volatile state which can be pumped out of the processing chamber 100. The sublimation process at block 208 removes the etching byproduct from the substrate 101 and is performed in the same chamber where the remote plasma etching process at block 206 is performed, such as the processing chamber 100 as described above, i.e., in-situ.

The sublimation process is performed by supplying sublimation gas into the chamber 100 at a high temperature to sublimate the etching byproduct. In one embodiment, the sublimation gas includes an inert gas, for example, but not limited to, helium gas, argon gas, or nitrogen gas. For example, the sublimation gas may be helium gas supplied at about 600 sccm. The sublimation temperature is selected based on the specific etching byproduct. In one embodiment, the etching byproduct, e.g., $(NH_4)_2SiF_6$, requires a sublimation temperature greater than about 110 degrees Celsius, e.g., greater than about 120 degrees Celsius or greater than about 150 degrees Celsius. In another embodiment, the sublimation temperature is greater than the etching process temperature, such as greater than 110 degrees Celsius, e.g., greater than about 120 degrees Celsius or greater than about 150 degrees Celsius. In one embodiment, blocks 206 and 208 are performed cyclically until desired results are achieved.

As discussed above, heat transfer from the gas distribution plate 170 to the substrate 101 increases as the chamber pressure level increases, and vice-a-versa; heat transfer from the gas distribution plate 170 to the substrate 101 decreases as the chamber pressure level decreases. Similarly, heat transfer from the substrate 101 to the electrostatic chuck increases as the chamber pressure level increases, and vice-a-versa; heat transfer from the substrate 101 to the electrostatic chuck decreases as the chamber pressure level decreases. As it is desirable to increase the substrate 101 temperature for the sublimation process, an optimal pressure range between high and low pressure levels is desired such that the heat transfer from the gas distribution plate to the substrate 101 is optimal and the heat transfer from the substrate 101 to the electrostatic chuck is minimal.

Therefore, at about 200 mTorr, about 500 mTorr, or about 800 mTorr, the gas distribution plate 170 quickly increases the temperature of the de-chucked substrate 101 from the previous etching temperature ranges to greater than about 110 degrees Celsius, as required for sublimating the etching byproduct. For example, at about 200 mTorr, about 40 seconds elapse for the de-chucked substrate 101 disposed about 0.3 inches from the gas distribution plate 170 to reach about 110 degrees Celsius. At about 500 mTorr and about 800 mTorr, about 20 seconds elapse for the de-chucked substrate 101 disposed about 0.3 inches from the gas distribution plate 170 to reach about 110 degrees Celsius.

Sublimation at greater than about 110 degrees Celsius for about 15 seconds to about 65 seconds, for example, between about 20 seconds to about 30 seconds or between about 30 seconds to about 60 seconds, advantageously sublimates etching byproducts quicker than conventional sublimation techniques (which require about 60 seconds to about 120 seconds). Additionally, since the substrate is de-chucked from the electrostatic chuck of the support member 185, the electrostatic chuck is not efficiently heated by the substrate 101. The electrostatic chuck is not heated to a temperature greater than 110 degrees thereby protecting the bonding material used to fabricate the electrostatic chuck from damage. As a result, the reliability of the electrostatic chuck is beneficially increased. Therefore, controlling the substrate 101 temperature at the above recited pressure and temperature ranges may desirably increase the sublimation rate, thereby increasing the overall sublimation process throughput.

Although the above process sequence 200 has been described as both: (i) increasing the temperature of the substrate 101 during the sublimation process; and (ii) decreasing the chamber pressure levels during the sublimation process, to achieve the desired sublimation temperatures, it is noted that performing (i) or (ii) will still achieve the desired sublimation temperatures.

While the foregoing is directed to embodiments of the present invention, other and further embodiments of the invention can be devised without departing from the basic scope thereof, and the scope thereof is determined by the claims that follow.

The invention claimed is:

1. A method for etching a dielectric layer disposed on a substrate, comprising:
   de-chucking the substrate from an electrostatic chuck having the substrate disposed thereon in an etching processing chamber; and
   cyclically etching the dielectric layer while the substrate is de-chucked from the electrostatic chuck, wherein the cyclical etching comprises:
      remotely generating a plasma from an etching gas mixture supplied into the etching processing chamber to etch the dielectric layer disposed on the substrate at a first temperature, wherein etching the dielectric layer generates etch byproducts;
      vertically moving the substrate towards a gas distribution plate in the etching processing chamber; and
      flowing a sublimation gas from the gas distribution plate towards the substrate to sublimate the etch byproducts at a second temperature, wherein the second temperature is greater than the first temperature.

2. The method of claim 1, wherein the first temperature is between about 65 degrees Celsius to about 95 degrees Celsius and the second temperature is greater than about 110 degrees Celsius.

3. The method of claim 2, wherein the first temperature is between about 70 degrees Celsius to about 90 degrees Celsius and the second temperature is greater than about 120 degrees Celsius.

4. The method of claim 1, wherein etching the dielectric layer is performed at a first pressure level and sublimating the etch byproducts is performed at a second pressure level, wherein the second pressure level is less than the first pressure level.

5. The method of claim 4, wherein the first pressure level is greater than about 1.5 mTorr, and the second pressure level is between about 100 mTorr and 900 mTorr.

6. The method of claim 1, wherein vertically moving the substrate comprises:
   having a distance between the gas distribution plate and the substrate that is about 0.1 inches to about 0.5 inches.

7. The method of claim 1, wherein prior to etching the dielectric layer, the gas distribution plate is heated at about 180 degrees Celsius.

8. The method of claim 1, wherein the etching gas mixture is a mixture of ammonia ($NH_3$) and nitrogen trifluoride ($NF_3$) gases.

9. The method of claim 1, wherein the sublimation gas is an inert gas.

10. A method for etching a dielectric layer disposed on a substrate, comprising:
    performing a treatment process on the substrate having the dielectric layer disposed thereon in an etching processing chamber, wherein the substrate is chucked on an electrostatic chuck;
    de-chucking the substrate from the electrostatic chuck; and
    etching the treated dielectric layer on the de-chucked substrate, wherein the etching comprises:
       (a) remotely generating a plasma from an etching gas mixture supplied into the etching processing chamber to etch the treated dielectric layer disposed on the substrate at a first temperature and a first pressure level, wherein etching the treated dielectric layer generates etch byproducts;
       (b) vertically moving the substrate towards a gas distribution plate in the etching processing chamber; and
       (c) flowing a sublimation gas from the gas distribution plate towards the substrate to sublimate the etch byproducts at a second temperature and a second pressure level, wherein the second temperature is greater than the first temperature and the second pressure level is less than the first pressure level, wherein (a)-(c) are performed cyclically.

11. The method of claim 10, wherein the treatment process includes bombarding the dielectric layer with an ion flux to alter surface properties of the dielectric material.

12. The method of claim 11, wherein the ions are argon species.

13. The method of claim 10, wherein second pressure level is about 200 mTorr, about 500 mTorr or about 800 mTorr.

14. The method of claim 10, wherein the dielectric layer is a carbon containing silicon layer (SiC), a nitrogen doped carbon containing silicon layer (SiCN), or the like.

15. The method of claim 10, wherein the sublimation gas is provided for between about 30 seconds to about 60 seconds.

16. The method of claim 10, wherein the dielectric layer is a porous SiCOH.

17. The method of claim 10, wherein vertically moving the substrate comprises:
    having a distance between the substrate and the gas distribution plate is between about 0.25 inches to about 0.3 inches.

18. A method for etching a dielectric layer disposed on a substrate, comprising:
    performing a treatment process on the substrate having the dielectric layer disposed thereon in an etching processing chamber, wherein the substrate is chucked on an electrostatic chuck, wherein the treatment process includes bombarding the dielectric layer with an ion flux to alter surface properties of the dielectric layer;
    de-chucking the substrate from the electrostatic chuck; and
    etching the treated dielectric layer on the de-chucked substrate, wherein the etching comprises:

(a) remotely generating a plasma from an etching gas mixture supplied into the etching processing chamber to etch the treated dielectric layer disposed on the substrate at a first temperature and a first pressure level, wherein etching the treated dielectric layer generates etch byproducts;
(b) vertically moving the substrate towards a gas distribution plate in the etching processing chamber; and
(c) flowing a sublimation gas from the gas distribution plate towards the substrate to sublimate the etch byproducts at a second temperature and a second pressure level, wherein the second temperature is greater than the first temperature and the second pressure level is less than the first pressure level, wherein (a)-(c) are performed cyclically.

19. The method of claim 18, wherein the sublimation gas is provided for between about 30 seconds to about 60 seconds.

20. The method of claim 18, wherein the ions are argon species.

\* \* \* \* \*